US010832793B2

(12) United States Patent
Johnson

(10) Patent No.: US 10,832,793 B2
(45) Date of Patent: Nov. 10, 2020

(54) DEFECTIVE MEMORY CELL DETECTION CIRCUITRY INCLUDING USE IN AUTOMOTIVE CONTROL SYSTEMS

(71) Applicant: MICRON TECHNOLOGY, INC., Boise, ID (US)

(72) Inventor: Christopher S. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 16/106,952

(22) Filed: Aug. 21, 2018

(65) Prior Publication Data

US 2020/0066368 A1 Feb. 27, 2020

(51) Int. Cl.
*G11C 29/00* (2006.01)
*G11C 29/52* (2006.01)

(52) U.S. Cl.
CPC ............ *G11C 29/785* (2013.01); *G11C 29/52* (2013.01); *G11C 29/781* (2013.01); *G11C 29/84* (2013.01)

(58) Field of Classification Search
None
See application file for complete search history.

(56) References Cited

U.S. PATENT DOCUMENTS

| | | | | |
|---|---|---|---|---|
| 5,650,965 A * | 7/1997 | Lee | ................... | G11C 16/3404 365/185.29 |
| 6,286,115 B1 * | 9/2001 | Stubbs | ................... | G11C 29/48 324/750.3 |
| 2002/0024844 A1 * | 2/2002 | Saeki | ................... | G11C 16/28 365/185.22 |
| 2003/0086327 A1 * | 5/2003 | Schreck | ................... | G11C 8/08 365/230.06 |
| 2005/0190615 A1 * | 9/2005 | Linde | ................. | G11C 29/4401 365/200 |
| 2007/0103978 A1 * | 5/2007 | Conley | ............. | G11C 16/0483 365/185.09 |
| 2010/0115376 A1 * | 5/2010 | Shalvi | ................. | G06F 11/1068 714/763 |
| 2013/0114340 A1 * | 5/2013 | Tailliet | ................... | G06F 11/20 365/185.11 |
| 2016/0133310 A1 * | 5/2016 | Wilson | ................. | G11C 29/022 365/185.18 |
| 2017/0255507 A1 * | 9/2017 | Milor | ..................... | G11C 29/24 |
| 2019/0065331 A1 * | 2/2019 | Singidi | .............. | G06F 11/1068 |
| 2019/0066791 A1 * | 2/2019 | Papa | ..................... | G06F 11/073 |
| 2019/0066799 A1 * | 2/2019 | Luo | ........................ | G11C 16/16 |

OTHER PUBLICATIONS

S. Soin, Y. R. Kishore and G. Singh, "Memory testing and fail bitmap generation for fault correlation," 2017 International conference on Microelectronic Devices, Circuits and Systems (ICMDCS), Vellore, 2017, pp. 1-6, (Year: 2017).*

* cited by examiner

*Primary Examiner* — Daniel F. McMahon
(74) *Attorney, Agent, or Firm* — Dorsey & Whitney LLP

(57) ABSTRACT

In some examples, a defective memory cell detection circuitry is configured to provide a failure signal indicative of a failure of a sub-group of memory cells (e.g., a row of memory cells). The failure signal is generated responsive to the failure of a sense line to transition to one of a set of reference voltages within a threshold time from a memory command. In some examples, failure signals indicative of a failure of a sub-group of memory cells is used by vehicle computer control systems to operate a vehicle.

25 Claims, 4 Drawing Sheets

DEFECTIVE MEMORY CELL DETECTION CIRCUITRY INCLUDING USE IN AUTOMOTIVE CONTROL SYSTEMS

BACKGROUND

Memory cells may fail to perform as intended, causing bad and/or unreliable data to be read from and/or written to defective memory cells. Memory cell defects may typically be reported on a single-cell basis. Error correction techniques typically involve a small number of bits. It may be difficult to identify larger-scale memory defects which affect larger portions of a memory array.

Autonomous driving systems are on the rise. Advance driving assist systems may be used which autonomously assist drivers in performing vehicle functions. Increasing amounts of on-board computation in vehicles put increasing demands on memory systems used in those vehicles.

DETAILED DESCRIPTION

Certain details are set forth herein to provide an understanding of described embodiments of technology. However, other examples may be practiced without various of these particular details. In some instances, well-known circuits, control signals, timing protocols, and/or software operations have not been shown in detail in order to avoid unnecessarily obscuring the described embodiments. Other embodiments may be utilized, and other changes may be made, without departing from the spirit or scope of the subject matter presented here.

Figure 1:
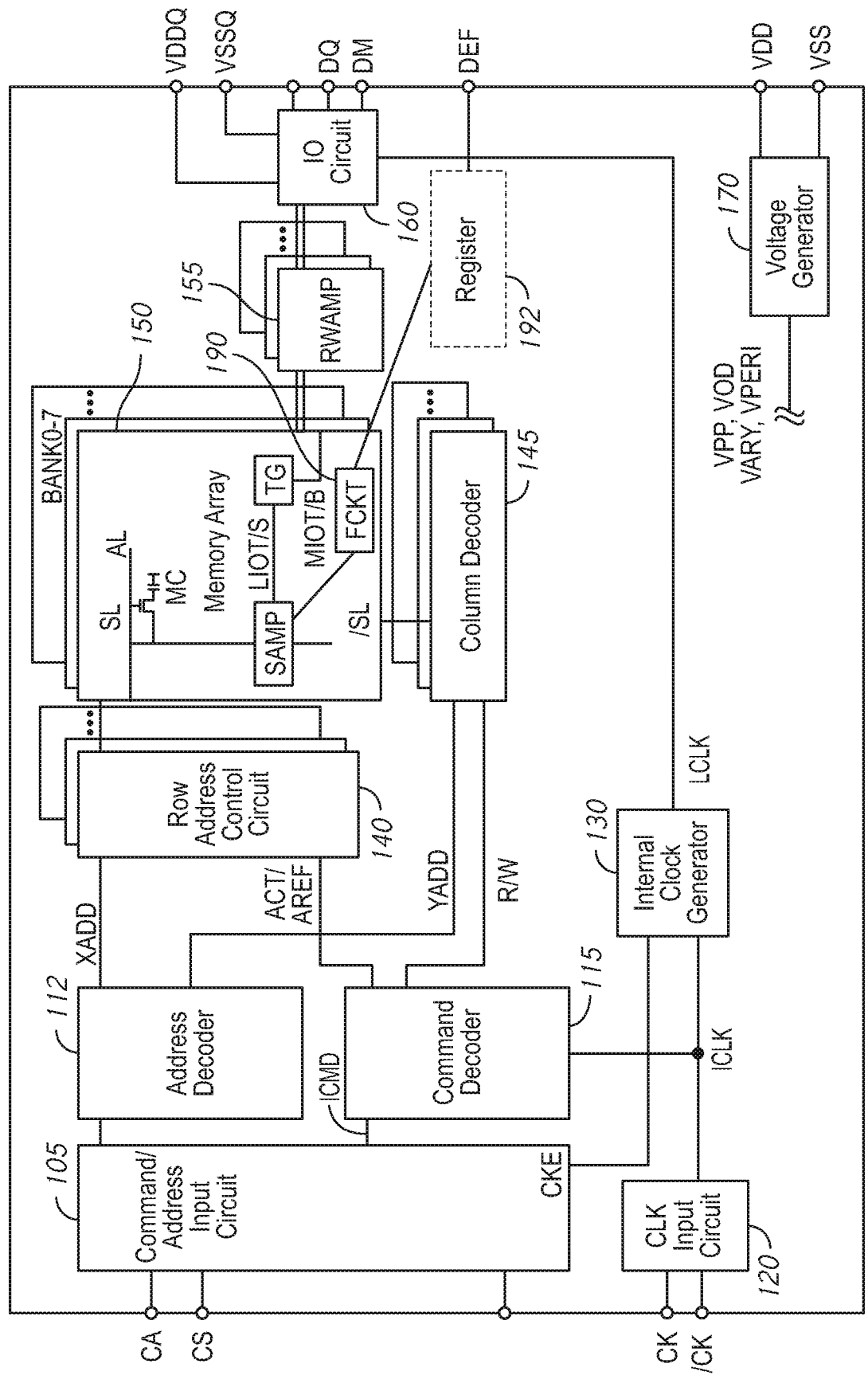
FIG. 1 is a block diagram of an apparatus according to an embodiment of the disclosure.

FIG. 1 is a block diagram of an apparatus according to an embodiment of the disclosure. The apparatus may include a semiconductor device 100 (e.g., a memory device). In some embodiments, the semiconductor device 100 may include, without limitation, a DRAM device, such as low power DDR (LPDDR) memory integrated into a single semiconductor chip, for example. The semiconductor device 100 includes memory array 150. The memory array 150 may include a plurality of banks, each bank including a plurality of access lines AL (e.g., the access lines may also be referred to as word lines), a plurality of sense lines SL and/SL (e.g., the sense lines may also be referred to as bit lines and/or digit lines), and a plurality of memory cells MC. The memory cells may be generally arranged at intersections of the plurality of access lines AL and the plurality of sense lines SL. For example, one or more access lines may be coupled to a group of memory cells (e.g., a row of memory cells) and may be used to activate the group of memory cells during operation. A single memory cell of the group (e.g., of the row) may be read from and/or written two by selecting it (e.g., selecting a "column") using the sense lines. The memory cells MC may be volatile memory cells, which may utilize periodic refreshing in order to maintain the data stored in the memory array.

The selection of the access line AL may be performed by a row address control circuit 140 and the selection of the sense line(s) SL may be performed by a column decoder 145. Sense amplifiers (SAMP) are located for their corresponding sense lines SL and/SL coupled to at least one respective local I/O line pair (LIOT/S), which may in turn be coupled to at least one respective main I/O line pair (MIOT/S), via transfer gates (TG), which function as switches. Defective memory cell detection circuitry (e.g., FCKT 190) may be provided. The defective memory cell detection circuitry may be coupled to one or more sense amplifiers (e.g., SAMP). For example, defective memory cell detection circuitry described herein may be coupled to sense lines which are in turn coupled to a sub-group of memory cells (e.g., a column) in the memory array. In some examples, one defective memory cell detection circuit may be coupled to multiple sense amplifiers. In some examples, separate defective memory cell detection circuits may be coupled to individual sense amplifiers. Generally, the defective memory cell detection circuitry may detect a failure that affects multiple memory cells in the memory array 150, such as a sub-group of the memory cells (e.g., a "row" of memory cells). The defective memory cell detection circuitry may provide a failure signal indicative of a failure affecting multiple memory cells. The failure signal may be provided to, for example, a memory controller, and/or an indication of the failure (e.g., one or more sub-group identifiers, such as a row identifier, and/or one or more memory cell identifiers) may be stored in register 192. The register 192 may be internal or external to the semiconductor device 100.

The memory array 150 may include a regular array and a redundant array. The regular array includes memory cells that are typically used to store data with the memory cells corresponding to respective memory addresses. The redundant array includes memory cells that may be used to "repair" defective memory cells of the regular array. The memory cells may be configured as redundant rows of memory and redundant columns of memory. The redundant rows of memory may be used to repair rows of memory of the regular array, and the redundant columns of memory may be used to repair columns of memory of the regular array. The redundant memory are used to repair defective memory cells of the regular array in some examples by having the memory addresses corresponding to the defect memory cells mapped to memory cells of the redundant array. As a result, when the memory address for the defective memory location is provided to the semiconductor device 100, the memory location in the redundant array to which the memory address is mapped is accessed instead of the defective memory location in the regular array corresponding to that memory address.

The semiconductor device 100 may employ a plurality of external terminals, which include command/address terminals CA that are coupled to a command and address bus to receive commands and addresses. The plurality of external terminals further includes clock terminals CK and CK/ to receive clock signals, data terminals DQ and data mask terminals DM, and power supply terminals VDD, VSS, VDDQ, and VSSQ. In some examples, the semiconductor device 100 may have a terminal FAIL.

The command/address terminals CA may be supplied with memory addresses, for example, from a memory controller. The memory addresses supplied to the command/address terminals CA are transferred, via a command/address input circuit 105, to an address decoder 112. The address decoder 112 receives the memory addresses and supplies decoded row addresses XADD to the row address control circuit 140, and supplies decoded column addresses YADD to the column decoder 145.

The command/address terminals CA may further be supplied with commands from, for example, a memory controller. The commands may be provided as internal command signals ICMD to a command decoder 115 via the command/address input circuit 105. The command decoder 115 includes circuits to decode the internal commands ICMD to generate internal commands and signals for performing operations. For example, the command decoder 115 may provide activation commands ACT and refresh commands AREF to the row address control circuit 140 to select an access line and may provide read/write commands R/W to the column decoder 145 to select a sense line. Refresh commands AREF may be provided by the command decoder 115 to the row control circuit 140 when a refresh operation is to be performed. The refresh command AREF may represent auto refresh commands that result from the semiconductor device 100 receiving a refresh command, and may also represent self refresh commands, which are generated internally when the semiconductor device 100 is set in a self refresh mode.

When a read command is received and a memory address is timely supplied with the read command, read data is read from a memory cell in the memory array 150 designated by the memory address. The read data is output to outside from the data terminals DQ via read/write amplifiers 155 and the input/output circuit 160. When a write command is received and a memory address is timely supplied with the write command, write data and a data mask (when applicable) are supplied to the data terminals DQ and DM, and the write data is written to a memory cell in the memory array 150 designated by the memory address. The write data is received by data receivers in the input/output circuit 160, and supplied via the input/output circuit 160 and the read/write amplifiers 155 to the memory array 150.

During the access operations for read and write commands, the row address control circuit 140 may include circuits for determining whether a memory address has been mapped to memory locations in the redundant array, for example, when a memory address corresponding to a defective memory location in the regular array has been mapped to memory locations of the redundant array (e.g., a redundant row of memory). The memory addresses that have been remapped are stored, and memory addresses associated with access operations are compared with the stored memory addresses. The memory addresses that have been mapped to redundant memory may be stored in nonvolatile storage. An example of a nonvolatile storage are fuse circuits (as well as antifuse circuits) that are programmed with the memory addresses to be stored. When a memory address associated with an access operation matches a stored memory address, memory locations in the redundant array are accessed instead of the memory locations in the regular array.

As previously described, the volatile memory cells are periodically refreshed in order to maintain the data stored by the memory array. The memory cells are typically refreshed as rows of memory cells. The row address control circuit 140 may include a refresh control circuit that is used during refresh operations. Refresh operations are performed when active refresh commands AREF are provided to the row address control circuit 140. Each refresh command AREF results in memory locations associated with a refresh address to be refreshed. In some embodiments of the disclosure, the refresh address may be generated internally in the semiconductor device 100. Similar circuits and operation may be included in the column decoder 145 in some embodiments of the disclosure.

Turning to an explanation of the external terminals included in the semiconductor device 100, the clock terminals CK and /CK are supplied with complementary external clock signals. The external clock signals may be supplied to a clock input circuit 120. The clock input circuit 120 may generate internal clock signals ICLK. The internal clock signals ICLK are supplied to internal clock generator circuit 130 and to the command decoder 115. When enabled by clock enable CKE from the command/address input circuit 105, circuits of the internal clock generator circuit 130 provide various internal clock signals LCLK based on the internal clock signals ICLK. The internal clock signals LCLK may be used for timing the operation of various internal circuits. For example, the LCLK signals may be provided to the input/output circuit 160 for timing the operation of the input/output circuit 160 to provide and receive data on the data terminals DQ.

The power supply terminals VDD and VSS are supplied with power supply potentials. These power supply potentials are supplied to an internal voltage generator circuit 170. The internal voltage generator circuit 170 generates various internal potentials VPP, VOD, VARY, VPERI, and the like based on the power supply potentials provided to the power supply terminals VDD and VSS. The internal potential VPP is mainly used in the row address control circuit 140, the internal potentials VOD and VARY are mainly used in the sense amplifiers SAMP included in the memory array 150, and the internal potential VPERI is used in many other peripheral circuit blocks.

The power supply terminals VDDQ and VSSQ are also supplied with power supply potentials. The power supply potentials are supplied to the input/output circuit 160. The power supply potentials provided to the power supply terminals VDDQ and VSSQ may be the same potentials as the power supply potentials provided to the power supply terminals VDD and VSS in some embodiments of the disclosure. Dedicated power supply potentials may be provided to the power supply terminals VDDQ and VSSQ so that power supply noise generated by the input/output circuit 160 does not propagate to the other circuit blocks.

When a failure is detected by one or more of the defective memory cell detection circuits described herein, failure signal(s) provided by defective memory cell detection circuitry described herein may be provided at terminal FAIL.

Figure 2:
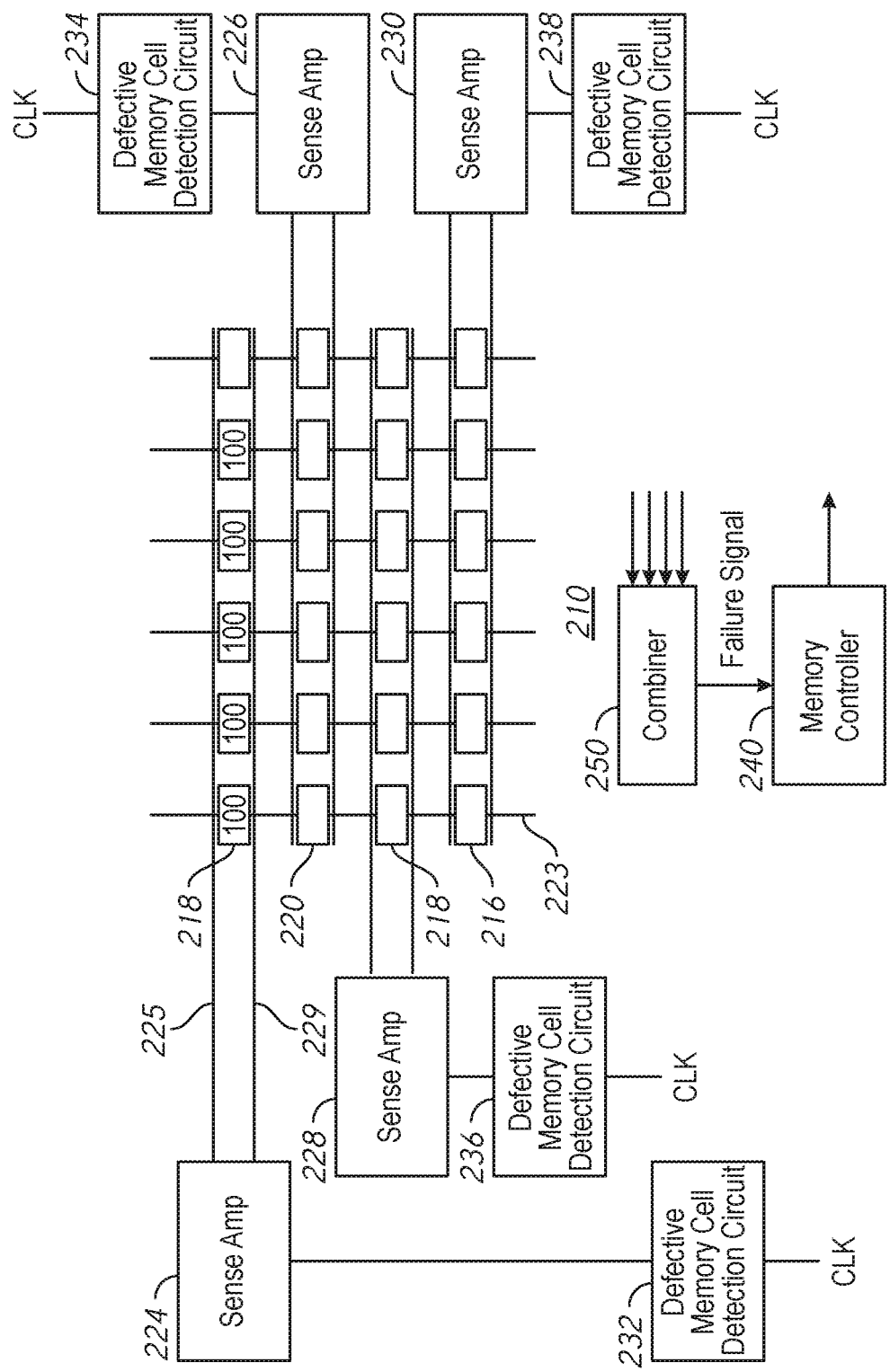
FIG. 2 is a block diagram of an apparatus according to an embodiment of the disclosure.

FIG. 2 is a block diagram of an apparatus according to an embodiment of the disclosure, The semiconductor device 100 of FIG. 1 may be used to implement and/or may be implemented using portions of the apparatus of FIG. 2 in some examples. FIG. 2 includes memory array 210, which includes memory cells, such as memory cells 216, 218, 220, and 222. FIG. 2 includes sense amplifiers 224, 226, 228, and 230. The sense amplifiers are coupled to respective defective memory cell detection circuits 232, 234, 236, and 238, FIG. 2 further includes a combiner 250 which may be coupled to the defective memory cell detection circuits 232, 234, 236, and 238. FIG. 2 further includes memory controller 240 which may be coupled to the sense amplifiers and/or defective memory cell detection circuits and/or combiner of FIG. 2.

FIG. 2 illustrates memory array 200 including memory cells 212, 214, 216, 218, 220, and 222. Generally any number or arrangement of memory cells may be used. The memory cells MC of FIG. 1 may be used to implement and/or may be implemented by the memory cells shown in FIG. 2. The memory cells may be arranged in sub-groups (e.g., rows). Each sub-group of the memory cells may be activated as a group. For example, an access line may be connected to a sub-group of memory cells. The access line 223 is shown in FIG. 2 connected to a sub-group of memory cells which includes memory cells 216, 218, 220, and 222. A voltage or other signal may be provided on the access line 223 to activate the memory cells in the sub-group.

Sense amplifiers are shown in FIG. 2, including sense amplifiers 224, 226, 228, and 230. The sense amplifiers may be coupled to each of a plurality of memory cells using sense lines. For example, the sense amplifier 124 is coupled between sense lines 225 and 229. During operation, the sense amplifiers may be used to select a particular memory cell of an activated sub-group to read from and/or write to. For example, when the sub-group of memory cells is activated using access line 223, the memory cell 222 may be read from and/or written to using sense amplifier 224. The memory cell 220 may be read from and/or written to using sense amplifier 226. The memory cell 218 may be read from and/or written to using sense amplifier 228. The memory cell 216 may be read from and/or written to using sense amplifier 230. In this manner, sense amplifiers may generally be used to sense data read from a selected memory cell.

When a sense amplifier reads a memory cell, the sense amplifier provides an indication of whether the sense lines coupled to the memory cell have transitioned to a high value (e.g., a '1') or a low value (e.g., a '0'). When a memory cell stores a '1', for example, it may transition the sense lines to a first reference voltage. When a memory cell stores a '0', it may transition the sense lines to a second reference voltage. The reference voltages may be power supply voltages or fractions thereof (e.g., ground, $V_{DD}$ and/or $V_{SS}$). The sense amplifiers may be utilized to discriminate between the presence of the first or second reference voltages on the sense lines to read the memory cell.

If the memory cell is defective, it may not definitively transition the sense lines to either reference value. The sense amplifier may nonetheless report data from the memory cell as being one value or another (e.g., a '1' or a '0'), however the data may not be correct. Moreover, when the memory cell is defective, the sense amplifier may take a longer time when reading the memory cell and/or writing to the memory cell to accomplish the read and/or write operation.

Examples described herein accordingly may include defective memory cell detection circuits coupled to one or more sense amplifiers described herein. For example, the defective memory cell detection circuitry 232 is coupled to sense amplifier 224. The defective memory cell detection circuitry 234 is coupled to sense amplifier 226. The defective memory cell detection circuitry 236 is coupled to sense amplifier 228. The defective memory cell detection circuitry 238 is coupled to sense amplifier 230. The defective memory cell detection circuits of FIG. 2 may be implemented using and/or may be implemented by FCKT 190 in FIG. 1.

Examples of defective memory cell detection circuits described herein may provide a failure signal responsive to the sense amplifier not firing (e.g., not providing an output) until after a threshold time from receipt of a read and/or write command from the memory controller. For example, if a memory cell is not defective, a sense amplifier may be expected to fire (e.g., provide a stable output, such as a 0 and/or a 1) after a certain amount of time has elapsed. However, if the memory cell is defective, the sense amplifier may take a longer time to provide a stable output. Defective memory cell detection circuits described herein may be implemented using, for example, an analog delay line clocked by a clock circuit (CLK in FIG. 2). If the sense lines coupled to the defective memory cell detection circuit do not reach a reference voltage within a predetermined number of clock cycles, the failure signal may be provided. The predetermined number of clock cycles may be user programmable and may vary in different examples Accordingly, each of the defective memory cell detection circuits coupled to a sense amplifier may provide a failure signal indicating failure of a memory cell accessed by the sense amplifier. Generally, a defective memory cell detection circuit may provide a failure signal when at least one of an associated pair of sense lines is not at one of a set of predetermined reference voltages a threshold time after a read command or a write command is provided by the memory controller. The predetermined reference voltages may be power supply voltages, or fractions thereof.

Multiple defective memory cell detection circuits may be coupled to a combiner, such as combiner 250 of FIG. 2. The combiner may be implemented, for example, using a counter and/or an adder in some examples. The combiner may provide a failure signal indicative of a failure of multiple memory cells in a sub-group. For example, consider a situation where an entire sub-group of memory cells may be defective (e.g., due to a row defect). For example, the memory cells 216, 218, 220, and 222 may be defective due to a defect affecting multiple ones of the memory cells in the sub-group (e.g., a row defect). When the row is activated, each of the sense amplifiers 224, 226, 228, and 230 may take longer than a threshold time to fire, due to the defect in the sub-group. Accordingly, each of the defective memory cell detection circuits 232, 234, 236, and 238 may provide a failure signal. The combiner 250 may in turn provide a failure signal indicative of a defect affecting multiple memory cells in a sub-group of memory cells.

Defective memory cell detection circuits are shown in FIG. 2 coupled to each pair of sense lines in the memory array depicted. In some examples, defective memory cell detection circuits may be associated with fewer than all pairs of sense lines in a memory array (e.g., a selection of sense lines). The pairs of sense lines selected may be randomly distributed throughout the memory array, or may be selected in a manner intended to be representative of the array (e.g., uniformly and/or periodically distributed, such as every other row or every third row, etc.).

In some examples, the combiner 250 may provide a failure signal when all defective memory cell detection circuits corresponding to a sub-group memory cells provide a failure signal. In some examples, the combiner 250 may provide a failure signal when a percentage of defective memory cell detection circuits corresponding to a sub-group of memory cells provide a failure signal—such as 90 percent, 80 percent, 70 percent, 60 percent, 50 percent, or another percentage in other examples.

In this manner, defective memory cell detection circuitry may be provided herein which may provide a failure signal to a memory controller. The failure signal may be indicative of a defect affecting multiple ones of the memory cells in a sub-group of the memory cells. The defective memory cell detection circuitry of FIG. 2 may include defective memory cell detection circuits 232, 234, 236, and 238, and combiner 250. Each of the defective memory cell detection circuits 232, 234, 235, and 238 may provide a failure signal indicative of failure of a memory cell, and those individual failure signals may be combined into a failure signal indicative of a sub-group failure.

The combiner (and/or individual ones of the defective memory cell detection circuits) may provide failure signals to the memory controller 240. In some examples, the failure signal(s) may be provided directly to the memory controller 240. For example, the memory controller 240 may have a port (e.g., a terminal) for receipt of the failure signal. In some examples, the failure signal(s) or other information indicating a defect may be stored (e.g., logged) in a register (not shown in FIG. 2) which may be read by the memory controller 240. An identity of the memory cells and/or sub-groups of memory cells (e.g., rows) corresponding to the failure signal(s) may be stored in the register.

The memory controller 240 may be implemented using any of a variety of memory controllers. Generally, during operation, the memory controller may identify selected memory cells to be read from and/or written to. For example, the memory controller may provide read and/or write commands which may be decoded into column and/or row addresses by decoders (not shown in FIG. 2).

The memory controller 240 may take any of a variety of actions responsive to receipt of the failure signal. In some examples, the memory controller 240 may repair and/or attempt to repair a sub-group of memory cells indicated as defective by the failure signal. For example, the memory controller 240 may initiate use of a redundant row of memory cells to replace a row of memory cells indicated as defective.

Figure 3:
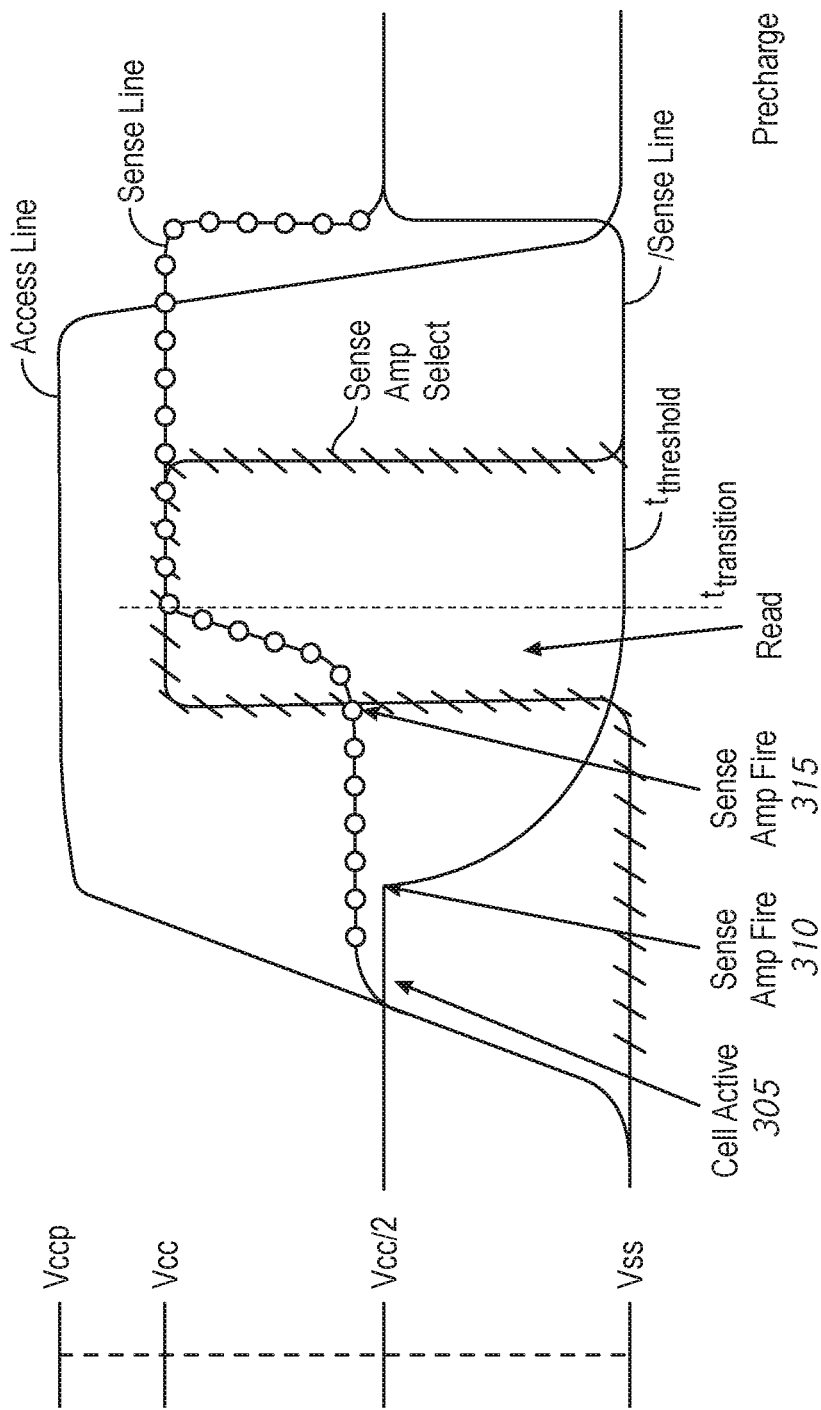
FIG. 3 is a timing diagram illustrating execution of a read command arranged in accordance with examples described herein.

FIG. 3 is a timing diagram illustrating execution of a read command arranged in accordance with examples described herein. The semiconductor device 100 of FIG. 1 and/or apparatus of FIG. 2 may operate in accordance with the timing diagram of FIG. 3 in some examples. FIG. 3 depicts voltage over time for multiple locations in a semiconductor device and/or apparatus. An access line, sense amp select line, sense line, and /sense line are shown. The access line of FIG. 3 may be implemented, for example, by an AL shown in FIG. 1 and/or access line 223 of FIG. 2. The sense amp select line may be representative of, for example, an output of column decoder 145 of FIG. 1. Generally, a transition of the sense amp select line may be used to select a cell in a sub-group of memory cells (e.g., within a row). The sense line and /sense line of FIG. 3 may be implemented by the SL and /SL of FIG. 1 and/or sense lines 225 and 229 of FIG. 2 in some examples.

While a timing diagram for a read operation is shown and described with reference to FIG. 3, it is to be understood that detection of defective memory cells may occur in an analogous manner during a write operation.

During a read operation a read command may be provided, for example by a memory controller. The read command may cause an access line to transition, as shown in FIG. 3 where the access line transitions from $V_{SS}$ to above $V_{CC}$ beginning at cell active time 305 $V_{SS}$ and $V_{CC}$ may be reference voltages (e.g., power supply voltages). The transition of the access line may activate a sub-group of memory cells. Accordingly, sense amplifiers associated with the sub-group of memory cells may begin to fire a period of time after the access line begins to transition.

Generally, a sense amplifier has been referred to herein in the singular—e.g., the sense amplifiers shown in FIGS. 1 and 2. However, each sense amplifier may include multiple sense amplifier circuits, (e.g., two sense amplifier circuits, each coupled to a respective sense line). In the example of FIG. 3, one sense amplifier circuit may begin firing (e.g., may begin transitioning a sense line) at sense amp fire time 310. Another sense amplifier circuit may begin firing (e.g., may begin transitioning a sense line) at sense amp fire time 315. The different sense amp fire times may be due to the complementary nature of the sense amplifiers (e.g., one may be an N-type amplifier and the other a P-type).

A sense amp select line is shown providing a pulse beginning generally after the sense amp fire times. The sense amp select pulse may select the particular memory cell for reading—e.g., to provide the data stored in the memory cell to a data I/O line of a semiconductor device.

The example of FIG. 3 depicts a read operation of a non-defective memory cell. Accordingly, by time $t_{transition}$, both the sense line and the/sense line have transitioned to a reference voltage (e.g., $V_{cc}$ and $V_{ss}$ respectively). It is to be understood that the sense lines may not transition exactly to the reference voltages, rather, during normal operation the sense lines may transition substantially to the reference voltage (e.g., within a margin of error of that voltage, such as within 1%, 5%, and/or 10%).

Examples of defective memory cell detection circuits described herein may provide failure signals when the transition of one or both sense lines to a reference value fails to occur within a threshold time. For example, as shown in FIG. 3, the sense lines have transitioned in a non-defective memory cell by $t_{transition}$. However, if the sense lines had not transitioned by another time, $t_{threshold}$, the defective memory cell detection circuit associate with the memory cell may provide a failure signal.

The threshold time may be set based on expected performance of the memory cell. Generally, a memory cell may be expected to provide a sense line transition within a transition time. The threshold time may be selected to be larger than that expected transition time. In some examples, the threshold time may be set with reference to $t_{RCD}$. $T_{RCD}$ may refer to a row address to column address delay—generally a number of clock cycles between providing a sub-group address (e.g., a row address) to a memory controller and when a column may be selected (e.g., when a sense amp select signal may be provided). $T_{RCD}$ may accordingly reflect an expected amount of time between activating a sub-group and having a reliable sense line transition. Accordingly, $t_{threshold}$ may be set to a time greater than $t_{RCD}$. If the sense lines have not transitioned after $t_{RCD}$, a failure signal may be generated. In some examples, the threshold time may be 1% longer than $t_{RCD}$, 2% in some examples, 3% in some examples, 5% in some examples, 10% in some examples, and other threshold times may be used in other examples. In some examples, the transition time may be expressed in a number of clock cycles.

Examples of defective memory cell detection circuits described herein may monitor one or more sense lines to ensure transition before a threshold time. For example, defective memory cell detection circuits may count clock cycles (e.g., using a delay line) between a read and/or write command and a transition of a sense line. If the number of clock cycles is greater than a transition time, a failure signal may be generated.

Figure 4:
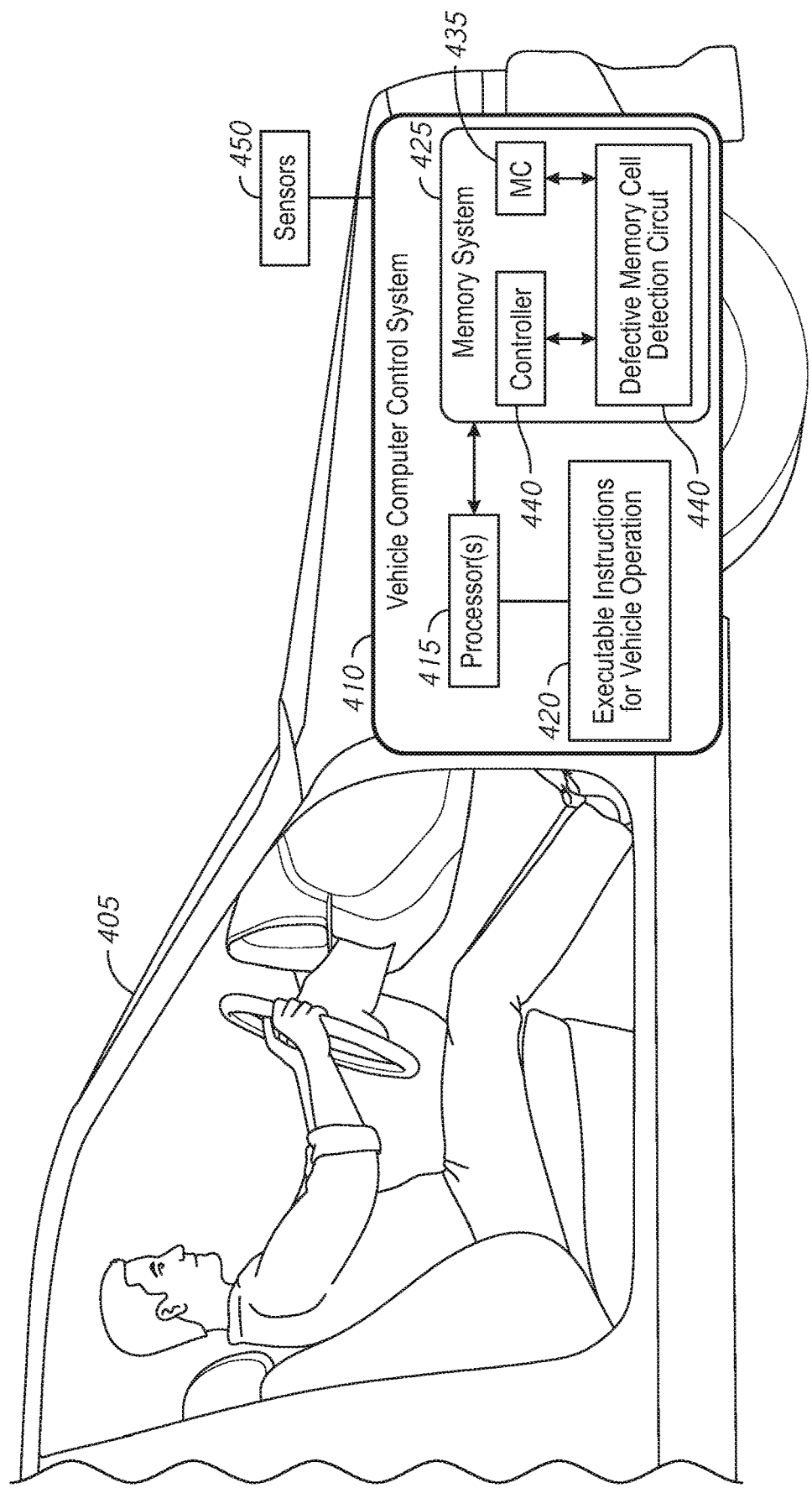
FIG. 4 is a schematic illustration of an automotive memory system arranged in accordance with examples described herein.

Examples described herein may find use in applications which may desirably be alerted to failure of a sub-group of memory cells. Examples of such applications include applications in automotive memory. FIG. 4 is a schematic illustration of an automotive memory system arranged in accordance with examples described herein.

FIG. 4 includes a vehicle 405 having a vehicle computer control system 410. The vehicle computer control system may include processor(s) 415, executable instructions for vehicle operation 420, and memory system 425. The memory system 425 may include a controller 430, memory cells 435, and defective memory cell detection circuitry 440.

Sensors 450 may be coupled to the vehicle computer control system 410. Semiconductor device 100 and/or the components of FIG. 2 may be used to implement memory system 425 in some examples. Additional, fewer, and/or different components may be used in other examples.

FIG. 4 illustrates vehicle 405. While an automobile is shown and described, it is to be understood that examples described herein may find use in other systems, including other vehicles. Examples include aircraft, spacecraft, drones, submarines or other watercraft, healthcare devices, and appliances.

The vehicle 405 may include a vehicle computer control system. The vehicle computer control system 410 may provide computer control of certain components of the vehicle 405. For example, the computer control system 410 may be used to wholly or partially control a direction, heading, speed, acceleration, or other driving parameter of the vehicle 405. In some examples, the computer control system 410 may additionally or instead be used to control a user interface of the vehicle 405, including to provide alerts, messages, images, displays, audio, and/or tactile feedback. In some examples, the computer control system 410 may be used to communicate with another computing system (e.g., another vehicle, a mobile device, a base station, a cloud computing service).

The vehicle computer control system may implement any of a variety of driving assist systems. Driving assist systems may include adaptive cruise control to maintain a distance from other cars through automatic adjustments of the vehicle's cruise control system. Driving assist systems may include automotive night vision, which may increase a driver's vision at night or in poor weather using a thermographic camera. Traffic sign recognition may be implemented which may allow a vehicle to recognize traffic signs such as speed limit, school zone or cross walk. Lane departure warnings may be provided when the vehicle begins to move out of its lane without signaling. Parking assistance may be provided for assisting drivers with parking the vehicle. Backup cameras may be provided for display of a field behind the vehicle and/or in other blind spot locations. Collision avoidance may be implement to alert drivers to potential collisions. Automatic electronic braking may be provided to automatically vary the force applied to a vehicle's wheels based on road conditions, speed, loading, etc. Smart headlights may be provided to automatically tailor headlamp range, helping to ensure maximum visibility without impacting other drivers.

One or more sensors 450 may be coupled to the vehicle computer control system 410. Sensors which may be used including, but are not limited to, cameras, image sensors, location sensors (e.g., GPS, inertial sensors), temperature sensors, humidity sensors, and the like.

The vehicle computer control system may include one or more processor(s) 415 and executable instructions for vehicle operation 420. The executable instructions for vehicle operation 420 may be encoded in one or more computer readable media in communication with the processor(s) 415. When executed by one or more of the processor(s) 415, the executable instructions for vehicle operation 420 may cause the vehicle computer control system 410 to provide control of one or more operations of the vehicle 405. In this manner, the vehicle computer control system 410 may be programmed to perform certain controls. Examples include autonomous driving, object recognition, machine learning, communications, displays, etc.

During operation, the processor(s) 415 may access memory system 425 and utilize data stored by the memory system 425 to perform control operations. The memory system 425 may be implemented using, for example, one or more DRAM devices and/or any memory system described herein. The memory system 425 may store, for example, current and/or past performance data relating to vehicle 405 (e.g., speed, heading, acceleration, location), image data (e.g., data obtained from sensors 450), identity of other vehicles, etc. The data may be stored in the memory cells 435. The controller 430 may be used to access the memory cells 435.

Defective memory cell detection circuitry 440 may be provided to generate failure signal(s) responsive to failures of sub-groups of the memory cells 435 as described herein. For example, the defective memory cell detection circuitry 440 may be implemented using the defective memory cell detection circuits and combiner shown and described with reference to FIG. 3.

Accordingly, during operation, the defective memory cell detection circuitry 440 may provide a failure signal, e.g., to controller 430, responsive to detection of a failure that affects multiple memory cells in a sub-group of memory cells. In some examples, the memory controller 430 may respond differently to the failure signal depending on the intended use of the data stored in the memory cells indicated as having a defect.

For example, the vehicle computer control system 410 may implement a number of algorithms for vehicle control. The various algorithms may have different error tolerances. Indications of the different error tolerances may be stored and may be accessible to the controller 410. For example, certain algorithms pertaining to the display of images over a user interface to a driver (e.g., a back-up camera, entertainment system images) may have a higher error tolerance than certain algorithms pertaining to control of vehicle operation (e.g., control of speed, heading acceleration) or certain algorithms pertaining to hazard identification (e.g., image recognition for signs, buildings, pedestrians).

When the controller 430 receives a failure signal indicating failure of a sub-group of memory cells, the controller 430 may identify algorithms of the vehicle computer control system 410 which may utilize data stored at the failed sub-group. If the algorithms using the data at the failed sub-group have an error tolerance above a high threshold, the controller 430 may not take any action, or may cause the vehicle computer control system 410 to display a memory error to a user and suggest repair. In some examples, the controller 430 may simply cause the computer control system 410 to disregard data from the defective memory cells. If the algorithms using the data at the failed sub-group have an error tolerance below a low threshold, the controller 430 may cause the vehicle computer control system 410 to alter vehicle operation. For example, the controller 430 may cause the vehicle computer control system 410 to slow and/or stop the vehicle, otherwise change speed, heading, and/or acceleration, to transition out of autonomous operation, and/or to communicate with another computing system (e.g., communicate with another vehicle, such as by providing a notification signal). For example, the vehicle computer control system 410 may communicate with another vehicle that the vehicle 405 has defective memory. Other vehicles may take appropriate action (e.g., provide more spacing or otherwise prepare for unpredictable behavior of vehicle 405). In some examples, the vehicle computer control system 410 may request replacement data from another computing system, such as another vehicle. For example, image data stored in memory cells 435 may also be stored in other computing systems accessible to the vehicle computer control system 410.

From the foregoing it will be appreciated that, although specific embodiments have been described herein for purposes of illustration, various modifications may be made while remaining with the scope of the claimed technology.

Examples described herein may refer to various components as "coupled" or signals as being "provided to" or "received from" certain components. It is to be understood that in some examples the components are directly coupled one to another, while in other examples the components are coupled with intervening components disposed between them. Similarly, signal may be provided directly to and/or received directly from the recited components without intervening components, but also may be provided to and/or received from the certain components through intervening components.

What is claimed is:

1. An apparatus comprising:
    memory cells including a sub-group of the memory cells coupled to an access line;
    pairs of sense lines, each respective pair of sense lines coupled to a respective memory cell in the sub-group of the memory cells;
    sense amplifiers, each respective sense amplifier coupled to a respective pair of sense lines, each sense amplifier configured to sense data read from at least a selected one of the memory cells of the sub-group of memory cells; and
    defective memory cell detection circuitry coupled to at least one of the sense amplifiers and configured to provide a failure signal responsive to detection of a failure of at least one of the respective pair of sense lines coupled to the sense amplifier, the failure signal indicative of a defect affecting multiple ones of the memory cells in the sub-group of the memory cells.

2. The apparatus of claim 1, wherein the memory cells are arranged in rows, and wherein the sub-group of the memory cells comprises a row of memory cells.

3. The apparatus of claim 1, wherein the failure signal is provided to a port of a memory controller.

4. The apparatus of claim 1, wherein the defective memory, cell detection circuitry is configured to provide the failure signal when the at least one of the respective pair of sense lines is not at one of a set of predetermined reference voltages a threshold time after a read command or a write command is provided by a memory, controller.

5. The apparatus of claim 4, wherein the predetermined reference voltages comprise power supply voltages.

6. The apparatus of claim 1, further comprising a register configured to receive the failure signal and store an indication of the defect.

7. The apparatus of claim 1, wherein the sub-group of memory cells are repaired by a memory controller responsive to receipt of the failure signal.

8. A method comprising:
    activating a sub-group of memory cells using an access line coupled to the sub-group of memory cells;
    monitoring pairs of sense lines coupled to individual ones of the sub-group of memory cells via a sense amplifier associated with the pairs of sense lines; and
    providing a failure signal responsive to a voltage on at least one of the pairs of sense lines failing to reach one of a plurality of reference voltages a threshold time after said activating.

9. The method of claim 8, further comprising storing, in a register, an indication of the sub-group of memory cells affected by the defect.

10. The method of claim 8; further comprising providing the failure signal to a memory controller configured to control a memory device including the sub-group of memory cells.

11. The method of claim 8, further comprising repairing the sub-group of memory cells responsive to the failure signal.

12. The method of claim 11, wherein repairing the sub-group of memory, cells comprises activating a redundant sub-group of memory cells.

13. The method of claim 8, wherein the reference voltages comprise power supply voltages.

14. A system comprising:
    memory including a plurality of memory cells each coupled to one or more sense lines;
    defective memory cell detection circuitry coupled to the memory and configured to provide a failure signal indicative of a defect affecting a sub-group of memory cells of the memory by determining a failure on the one or more sense lines of at least a memory cell of the plurality of memory cells responsive to a read or write command;
    a memory controller coupled to the defective memory cell detection circuitry, the memory controller configured to provide the read or write command and receive the failure signal from the defective memory cell detection circuitry; and
    a vehicle computer control system coupled to the memory controller, the vehicle computer control system configured to utilize data stored in the memory to at least partially, control an automobile.

15. The system of claim 14, wherein the memory controller is configured to respond to the failure signal based on an error tolerance implemented by the automotive control system utilizing data in the sub-group of memory cells.

16. The system of claim 15, wherein the memory controller is configured to cause the automotive control system to communicate, alter control of the automobile, or both, responsive to the error tolerance being below a low threshold.

17. The system of claim 15, wherein the memory controller is configured to cause the automotive control system to disregard data from the sub-group of memory cells responsive to the error tolerance being above a high threshold.

18. The system of claim 14, wherein the automotive control system is configured to provide a notification signal to another automobile responsive to the failure signal.

19. A system comprising:
    memory;
    defective memory cell detection circuitry coupled to the memory and configured to provide a failure signal indicative of a defect affecting a sub-group of memory cells of the memory;
    a memory controller coupled to the defective memory cell detection circuitry, the memory controller configured to receive the failure signal; and
    a vehicle computer control system coupled to the memory controller, the vehicle computer control system configured to utilize data stored in the memory to at least partially control a vehicle, wherein the automotive control system is further configured to change a speed or heading of the vehicle responsive to the failure signal.

20. The system of claim 14, wherein the defective memory cell detection circuitry is configured to log the failure signal in a register, and wherein the memory controller is configured to read the register to identify the defect in the sub-group of memory cells.

21. The system of claim 19, wherein the memory controller is configured to respond to the failure signal based on an error tolerance implemented by the automotive control system utilizing data in the sub-group of memory cells.

22. The system of claim 21, wherein the memory controller is configured to cause the automotive control system to communicate, alter control of the automobile, or both, responsive to the error tolerance being below a low threshold.

23. The system of claim 21, wherein the memory controller is configured to cause the automotive control system to disregard data from the sub-group of memory cells responsive to the error tolerance being above a high threshold.

24. The system of claim 19, wherein the automotive control system is configured to provide a notification signal to another automobile responsive to the failure signal.

25. The system of claim 19, wherein the defective memory cell detection circuitry is configured to log the failure signal in a register, and wherein the memory controller is configured to read the register to identify the defect in the sub-group of memory cells.

\* \* \* \* \*